(12) United States Patent
Ketterson et al.

(10) Patent No.: US 11,791,312 B2
(45) Date of Patent: Oct. 17, 2023

(54) MMICS WITH BACKSIDE INTERCONNECTS FOR FANOUT-STYLE PACKAGING

(71) Applicant: Qorvo US, Inc., Greensboro, NC (US)

(72) Inventors: Andrew Arthur Ketterson, Dallas, TX (US); Christo Pavel Bojkov, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/558,393

(22) Filed: Sep. 3, 2019

(65) Prior Publication Data

US 2020/0176416 A1     Jun. 4, 2020

Related U.S. Application Data

(60) Provisional application No. 62/775,212, filed on Dec. 4, 2018.

(51) Int. Cl.

| | |
|---|---|
| *H01L 25/065* | (2023.01) |
| *H01L 23/66* | (2006.01) |
| *H01L 23/552* | (2006.01) |
| *H01L 23/31* | (2006.01) |
| *H01L 23/48* | (2006.01) |
| *H01L 23/528* | (2006.01) |
| *H01L 23/00* | (2006.01) |

(Continued)

(52) U.S. Cl.
CPC ........ *H01L 25/0655* (2013.01); *H01L 21/565* (2013.01); *H01L 23/3128* (2013.01); *H01L 23/481* (2013.01); *H01L 23/5226* (2013.01); *H01L 23/5283* (2013.01); *H01L 23/552* (2013.01); *H01L 23/66* (2013.01); *H01L 24/09* (2013.01); *H01L 25/0657* (2013.01); *H01L 2224/02373* (2013.01); *H01L 2224/02379* (2013.01); *H01L 2224/02381* (2013.01); *H01L 2924/1423* (2013.01)

(58) Field of Classification Search
None
See application file for complete search history.

(56) References Cited

U.S. PATENT DOCUMENTS

| | | | |
|---|---|---|---|
| 9,502,330 B1 * | 11/2016 | Gupta | ..................... H01L 23/66 |
| 2009/0302437 A1 * | 12/2009 | Kim | ..................... H01L 21/561 |
| | | | 257/E23.18 |

(Continued)

*Primary Examiner* — Khaja Ahmad
(74) *Attorney, Agent, or Firm* — Withrow & Terranova, P.L.L.C.

(57) ABSTRACT

Monolithic microwave integrated circuits (MMICs) with backside interconnects for fanout-style packaging are disclosed. Fanout-style packaging, such as fanout wafer (FOWLP) or fanout panel-level packaging (FOPLP), facilitates a high density package for MMICs. However, the fanout-style packaging may produce undesired electromagnetic (EM) coupling between a MMIC die and metal features in a redistribution layer (RDL) of the FOW/PLP package and/or a next higher assembly (NHA). In an exemplary aspect, a circuit package according to this disclosure includes the MMIC die and an RDL. The MMIC includes a chip side with components which may undesirably couple to metal signal lines (e.g., package metal interconnects) in the RDL. The chip side of the MMIC is oriented away from the RDL to reduce such EM coupling.

14 Claims, 10 Drawing Sheets

(51) Int. Cl.
    *H01L 21/56*     (2006.01)
    *H01L 23/522*     (2006.01)

(56) References Cited

U.S. PATENT DOCUMENTS

| | | | | |
|---|---|---|---|---|
| 2010/0244208 | A1* | 9/2010 | Pagaila | H01L 23/50 |
| | | | | 257/659 |
| 2010/0315787 | A1* | 12/2010 | Li | H05K 1/0206 |
| | | | | 361/709 |
| 2013/0200528 | A1* | 8/2013 | Lin | H01L 23/3157 |
| | | | | 257/774 |
| 2013/0292808 | A1* | 11/2013 | Yen | H01L 21/561 |
| | | | | 257/E23.114 |
| 2014/0247195 | A1* | 9/2014 | Yen | H01L 23/66 |
| | | | | 343/873 |
| 2015/0206870 | A1* | 7/2015 | Takatani | H01L 23/66 |
| | | | | 438/107 |
| 2017/0033062 | A1* | 2/2017 | Liu | H01L 23/528 |
| 2017/0346185 | A1* | 11/2017 | Wang | H01Q 1/2283 |
| 2018/0191051 | A1* | 7/2018 | Ndip | H01L 23/49827 |
| 2019/0295918 | A1* | 9/2019 | Trulli | H01L 23/3675 |

\* cited by examiner to the conductive pillars.

MMICS WITH BACKSIDE INTERCONNECTS FOR FANOUT-STYLE PACKAGING

RELATED APPLICATIONS

This application claims the benefit of U.S. Provisional Patent Application Ser. No. 62/775,212, filed Dec. 4, 2018, the disclosure of which is hereby incorporated herein by reference in its entirety.

FIELD OF THE DISCLOSURE

This application relates to packaging of radio frequency (RF) integrated circuits (ICs).

BACKGROUND

Mobile devices, such as cellular phones, demand increasingly smaller integrated circuits (ICs) including radio frequency (RF) circuits. The performance of high-frequency RF circuits in general and monolithic microwave integrated circuits (MMICs) in particular is sensitive to the coupling of electro-magnetic (EM) energy into nearby structures. As IC package and module sizes decrease, nearby metal features in the package or next higher assembly (NHA) can couple to these RF circuits and perturb their performance. Such coupling is becoming more of a problem, especially for RF frequencies above 2 gigahertz (GHz).

SUMMARY

Monolithic microwave integrated circuits (MMICs) with backside interconnects for fanout-style packaging are disclosed. Fanout-style packaging, such as fanout wafer-level packaging (FOWLP) or fanout panel-level packaging (FOPLP), facilitates a high density package for MMICs. However, fanout-style packaging may produce undesired electromagnetic (EM) coupling between a MMIC die and metal features in a redistribution layer (RDL) of the FOW/PLP package and/or a next higher assembly (NHA). In an exemplary aspect, a circuit package according to this disclosure includes the MMIC die and an RDL. The MMIC includes a chip side with components which may undesirably couple to metal signal lines (e.g., package metal interconnects) in the RDL. The chip side of the MMIC is oriented away from the RDL to reduce such EM coupling.

The MMIC further includes backside interconnects, also known as hot vias, such that the interface to the package metal interconnects in the RDL is from the backside rather than from the front side of the die. In this configuration, the MMIC die is more immune to interference from the underlying RDL itself or from the substrate used in the NHA. This can also facilitate improved thermal paths for heat dissipation, such as through the RDL or through an overmold layer of the circuit package.

An exemplary embodiment relates to a circuit package. The circuit package includes a first MMIC die and an overmold layer at least partially surrounding the first MMIC die. The circuit package further includes an RDL attached to a surface of the first MMIC die, comprising a plurality of signal lines connected to conductors of the first MMIC die. The circuit package further includes an interconnection layer attached to the RDL and configured to electrically connect the plurality of signal lines in the RDL to a higher-level assembly.

Another exemplary embodiment relates to a method for packaging a MMIC die. The method includes overmolding a first MMIC die and forming an RDL over a surface of the first MMIC die. Forming the RDL includes depositing a first signal line on a first conducting element in the first MMIC die, depositing a second signal line on a second conducting element in the first MMIC die, and depositing an insulating material to isolate the first signal line from the second signal line. The method further includes depositing a ball grid array over the RDL such that a first ball is electrically connected to the first signal line and a second ball is electrically connected to the second signal line.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
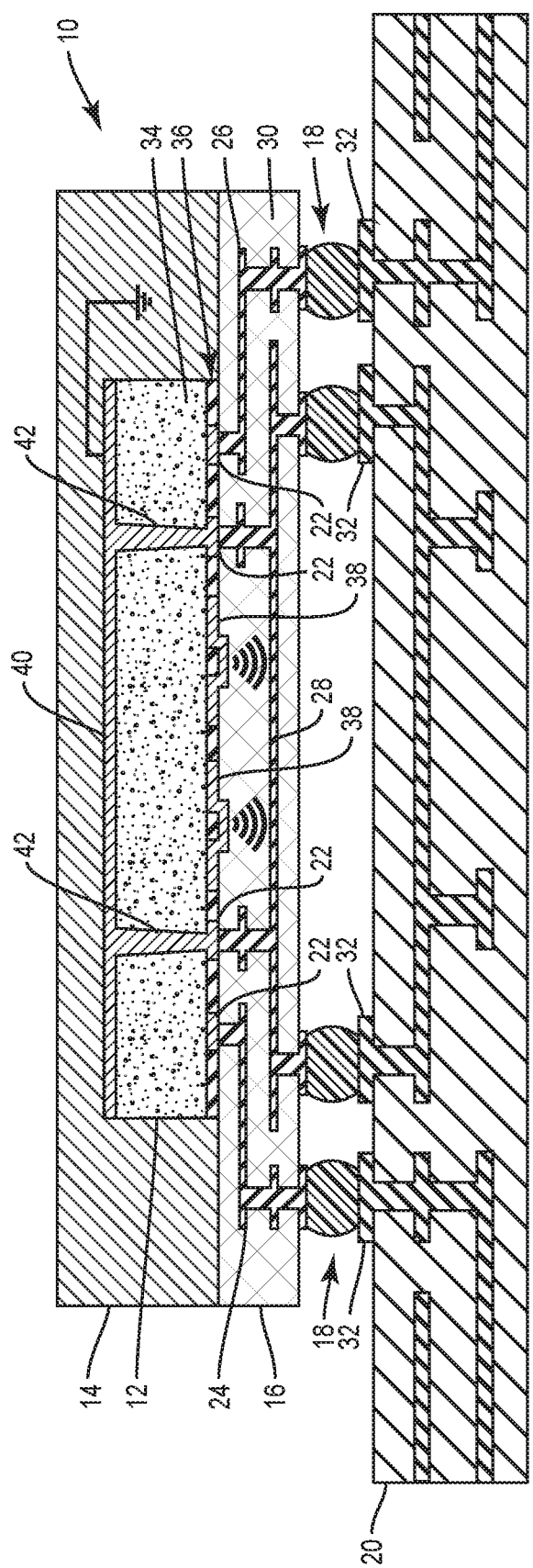
FIG. 1 is a cross-sectional view of an exemplary embodiment of a circuit package for a monolithic microwave integrated circuit (MMIC) die.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Monolithic microwave integrated circuits (MMICs) with backside interconnects for fanout-style packaging are disclosed. Fanout-style packaging, such as fanout wafer-level packaging (FOWLP) or fanout panel-level packaging (FOPLP), facilitates a high density package for MMICs. However, fanout-style packaging may produce undesired electromagnetic (EM) coupling between a MMIC die and metal features in a redistribution layer (RDL) of the FOW/PLP package and/or a next higher assembly (NHA). In an exemplary aspect, a circuit package according to this disclosure includes the MMIC die and an RDL. The MMIC includes a chip side with components which may undesirably couple to metal signal lines (e.g., package metal interconnects) in the RDL. The chip side of the MMIC is oriented away from the RDL to reduce such EM coupling.

The MMIC further includes backside interconnects, also known as hot vias, such that the interface to the package metal interconnects in the RDL is from the backside rather than from the front side of the die. In this configuration, the MMIC die is more immune to interference from the underlying RDL itself or from the substrate used in the NHA. This can also facilitate improved thermal paths for heat dissipation, such as through the RDL or through an overmold layer of the circuit package.

FIG. 1 is a cross-sectional view of an exemplary embodiment of a circuit package 10 for a MMIC die 12. The circuit package 10 includes the MMIC die 12 surrounded by an overmold layer 14 and attached to an RDL 16. An interconnection layer 18 attaches the RDL 16 to an NHA 20, which may be a printed circuit board (PCB) or another component which supports the circuit package 10 and/or electrically connects the MMIC die 12 to other components in an RF device (e.g., a mobile device).

In this regard, the circuit package 10 can form a radio frequency (RF) module in which the MMIC die 12 is packaged using FOWLP, also referred to as wafer-level fanout (WLFO) packaging. Other examples are packaged with FOPLP or a similar packaging approach. FOWLP and FOPLP are packaging technologies that allow the use of semiconductor-like thin-film processes (e.g., high-resolution lithographic patterning, physical vapor deposition (PVD) metallizations and chemical vapor deposition (CVD) dielectrics) to spread out (e.g., fan out) dense input/output (I/O) connections on the MMIC die 12 to accommodate the larger dimensions on the NHA, such as a PCB, interposer, or chip-scale package (CSP).

For example, in one embodiment of the FOWLP process, known-good die (KGD) (e.g., the MMIC die 12 and a plurality of additional MMIC dice) and sometimes other passive components are precisely placed onto a temporary carrier (not shown), often called reconstructed wafer, and epoxy over-molded to form the overmold layer 14. The KGD can be formed from one or more MMIC wafers which are diced to form the MMIC die 12 and a plurality of additional MMIC dice, then overmolded into an overmolded MMIC array. A portion of the overmold layer 14 can be removed to expose a top and/or bottom surface of the MMIC die 12 such that the overmold layer 14 partially surrounds the MMIC die 12 (e.g., surrounding only sides of the MMIC die 12 or sides and one of the top or bottom of the MMIC die 12). One or more RDLs 16 and dielectric layers are formed over the exposed surface of the MMIC die 12, and via holes are defined using semiconductor-like processes and tools to route metal traces away from tightly pitched input/output (I/O) pads 22 on the MMIC die 12 to the periphery of the circuit package 10 (or to other components within the same package in the case of a multi-chip module, such as illustrated below with respect to FIGS. 5A and 5B). Thus, the RDL 16 includes a plurality of signal lines 24, 26, 28 connected to the I/O pads 22 (e.g., conductors of the MMIC die 12) and an insulating material 30 which isolates at least some of the signal lines 24 from one another. For example, a first signal line 24 may be isolated from a second signal line 26 and a third signal line 28.

Depending on whether a chips-first or chips-last approach is used, the RDL 16 interconnects (e.g., signal lines 24, 26, 28) are either formed directly on top of the overmolded MMIC die 12 or are formed on the carrier before the MMIC die 12 (and other components) is attached and overmolded. In some examples, the RDL 16 is formed as a multilayer laminate. With the I/O pads 22 now redistributed (i.e. fanned out), the circuit package 10 is capable of being attached to NHA pads 32 arrayed at a wider pitch on the NHA 20 (here illustrated as a multilayer PCB, though other configurations can be used). The interconnection layer 18 (e.g., a ball grid array, a land-grid array, or another appropriate interconnection) is used to attach the circuit package 10 to the NHA 20 and connect the signal lines 24, 25, 28 in the RDL 16 to the NHA pads 32. After the RDL layer 16 or the interconnection layer 18 is formed, the overmolded MMIC array can be diced into the circuit package 10.

The MMIC die 12 includes a MMIC substrate 34 on which an active layer 36 is formed, which may be referred to as a chip side of the MMIC die 12. In the exemplary embodiment depicted in FIG. 1, the MMIC die 12 is oriented chip side down, i.e., with the chip side facing the RDL 16. One or more components 38 which are sensitive to EM coupling may be part of or coupled to the active layer 36. For example, passive components 38 may be coupled to the active layer 36, such as RF transmission lines, tuning networks, interconnecting conductors, and so forth. In some examples, one or more of these passive components 38 may be particularly sensitive to EM coupling with structures near the MMIC die 12. In some examples, the active layer 36 can further include EM-sensitive active elements, such as transistors and diodes.

The MMIC die 12 can also include a ground plane 40 on an opposite surface of the MMIC die 12 from the active layer 36 (e.g., the backside of the MMIC die 12). The ground plane 40 may be electrically connected to the RDL 16 by one or more ground hot vias 42 through the MMIC substrate 34.

For high-frequency RF circuits, such as the MMIC die 12, the proximity of the signal lines 24, 26, 28 in the RDL 16 can cause undesirable coupling with the EM-sensitive components 38 that interferes with the proper operation and performance of the circuit in the circuit package 10. Careful simulation and modeling of the influence of these nearby metal features is required to design high-frequency circuits for such an environment, especially for components that extend into millimeter-wave (mmW) frequency bands. Such simulations may still fall short of accounting for all interference factors and the resultant RF circuit or system performance can suffer.

Through careful design it is possible to use a layer of the RDL 16 in close proximity to the MMIC die 12 as a ground plane, which may effectively shield the circuit from the influence of other nearby metal traces. The effect of such a ground plane in the RDL 16 needs to be considered in the design of the MMIC die 12 since it will have a significant effect on the characteristics of the transmission lines. This means that the unpackaged MMIC die 12 without the ground plane will behave much differently than the circuit package 10, which can complicate wafer-level KGD testing and module troubleshooting.

Figure 2:
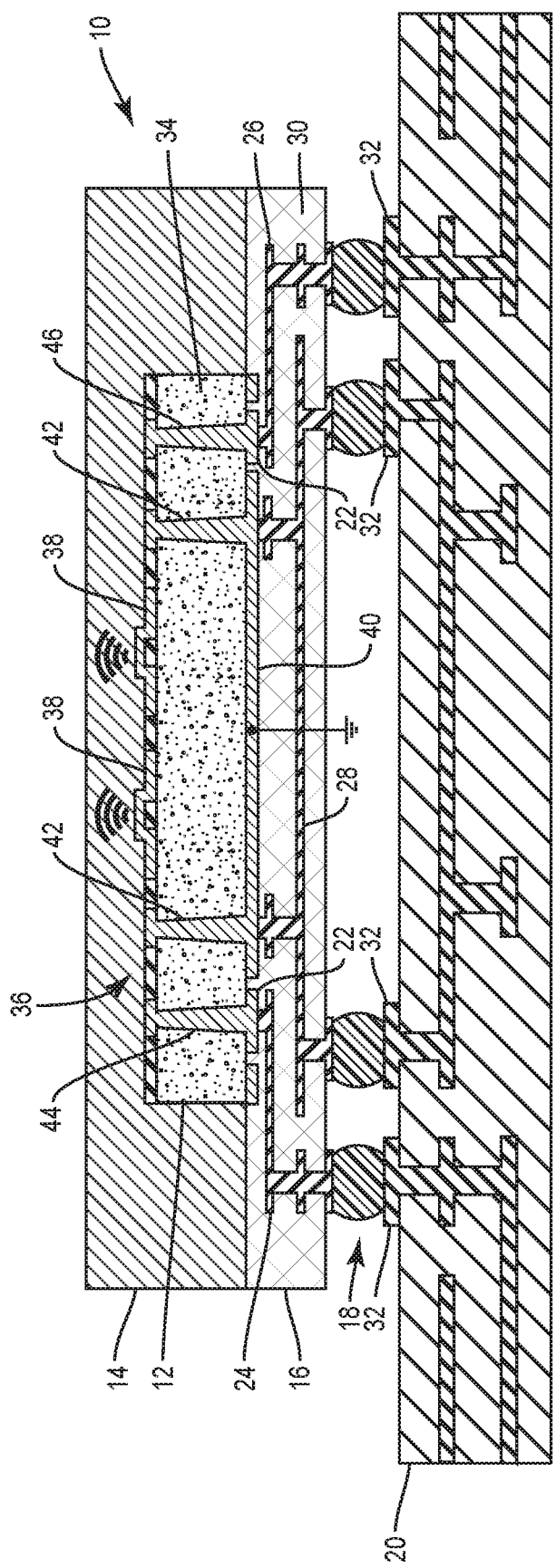
FIG. 2 is a cross-sectional view of another exemplary embodiment of the circuit package of FIG. 1 having a chip side up MMIC die.

FIG. 2 is a cross-sectional view of another exemplary embodiment of the circuit package 10 having a chip side up MMIC die 12. In order to reduce or eliminate EM coupling between the signal lines 24, 26, 28 in the RDL 16 with the EM-sensitive components 38 (e.g., passive components, such as RF transmission lines used for impedance matching, tuning networks, interconnecting conductors, and so on) of the MMIC die 12, the MMIC die 12 is oriented chip side up. That is, the chip side (e.g., the side with the active layer 36) of the MMIC die 12 is oriented away from the RDL 16.

In this regard, the surface of the MMIC die 12 attached to the RDL 16 includes the ground plane 40 (covering a portion or majority of the backside) and the I/O pads 22. The MMIC die 12 also includes backside interconnects, such as a plurality of hot vias 42, 44, 46, to interface with the corresponding signal lines 24, 26, 28 in the RDL 16. For example, a first signal hot via 44 connects the first signal line 24 to a component 38 on the chip side of the MMIC die 12 (through an I/O pad 22), and a second signal hot via 46 connects the second signal line 26 to another component 38 on the chip side (through another I/O pad 22). One or more ground hot vias 42 connect the ground plane 40 (and the third signal line 28) to an element or component 38 on the chip side of the MMIC die 12.

In this configuration, the backside ground plane 40 of the MMIC die 12 acts to shield the components 38 in the chip side up MMIC die 12 from the signal lines 24, 26, 28 in the RDL 16 and the NHA 20. The active layer 36 of the MMIC die 12 is covered by the overmold layer 14. In addition, the RDL 16 is designed according to good RF design practices for properly shielded controlled-impedance RF transmission lines using appropriate topologies (e.g., microstrip, stripline, etc.) for mmW circuits. Where traditional FOWLP packaging requires additional ground layers in the RDL 16, the ground plane 40 can further define a ground reference for the signal lines 24, 26 in the RDL 16 to reduce or eliminate such ground layers in the RDL 16.

An advantage of the embodiment of the circuit package 10 of FIG. 2 is that design optimization of the package routing in the RDL 16 and the NHA 20 can largely take place without affecting the performance of the MMIC die 12 since it is effectively shielded by its own backside ground plane 40 and decoupled from package design issues. In addition, the backside of the MMIC die 12 is significantly more planar than the chip side, which may have thick plated transmission lines and air-bridge cross-overs. The planarity of the backside is also advantageous in the FOWLP packaging flow, facilitating a better seal at the edges of the MMIC die 12, preventing creep of the mold compound during the overmolding process, and providing better patterning uniformity during the formation of the interconnects of the RDL 16.

Figure 3:
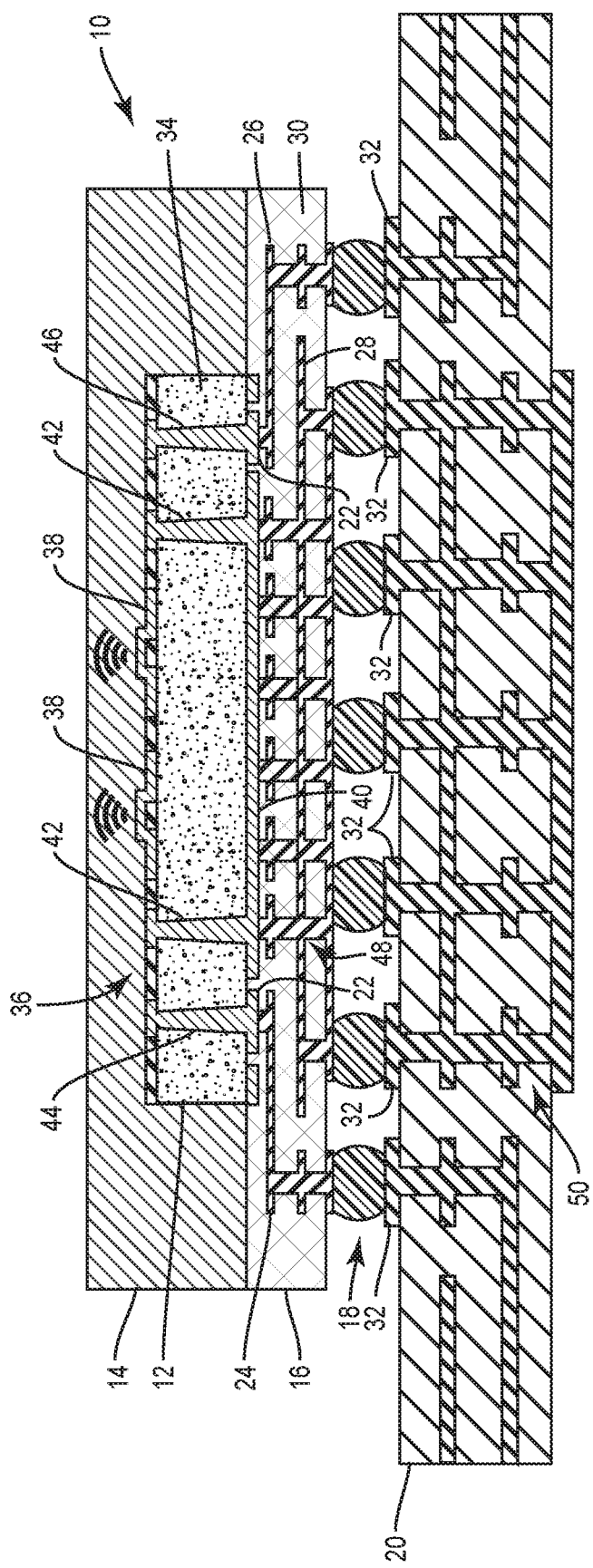
FIG. 3 is a cross-sectional view of another exemplary embodiment of the circuit package of FIG. 2 with a thermal path through a redistribution layer (RDL).

FIG. 3 is a cross-sectional view of another exemplary embodiment of the circuit package 10 with a thermal path through the RDL 16. The circuit package 10 of FIG. 3 has a chip side up MMIC die 12 as described above with respect to FIG. 2. Inverting the MMIC die 12 in the circuit package 10 in this manner has an impact on the direction of heat flow from the package into the NHA 20. In planar packaging technologies like FOWLP there are two paths for heat transfer: 1) through the bottom of the package (e.g., through the interconnection layer 18) into the NHA 20 and 2) through the top of the package (e.g., the side of the overmold layer 14) into a heat exchanger (e.g., a heatsink or cold plate).

In the latter case, for a conventional chip side down configuration the thermal conductivity can be improved by exposing the backside of the MMIC die 12 (or exposing a thermal spreader attached to the backside of the MMIC die 12) from within the overmold layer 14 through a subtractive grind/etch process or a selective molding process. However, in the exemplary circuit package 10 of FIG. 3 with the chip side up configuration, the top of the MMIC die 12, rather than the backside, is embedded in the overmold layer 14. In this configuration, the most natural thermal conduction path from the MMIC die 12 is through the interconnection layer 18 into the NHA 20. The ground plane 40 covers a majority of the backside of the MMIC die 12, therefore the thermal conductivity into the NHA 20 can be improved by contacting the backside through a dense array of ground RDL vias 48 (or one large area via, which may be referred to as an embedded heat slug (EHS)) through the RDL 16 to spread and better transfer the heat. The ground RDL vias 48 can be formed through a same metallization as the signal lines 24, 26, 28 in the RDL 16, such as copper. In this manner, the RDL 16 provides a thermal conduction path from the ground plane 40 to the NHA 20. The NHA 20 can similarly contain thermal vias 50 or a solid embedded heatsink to improve the conductivity to the NHA 20.

Figure 4A:
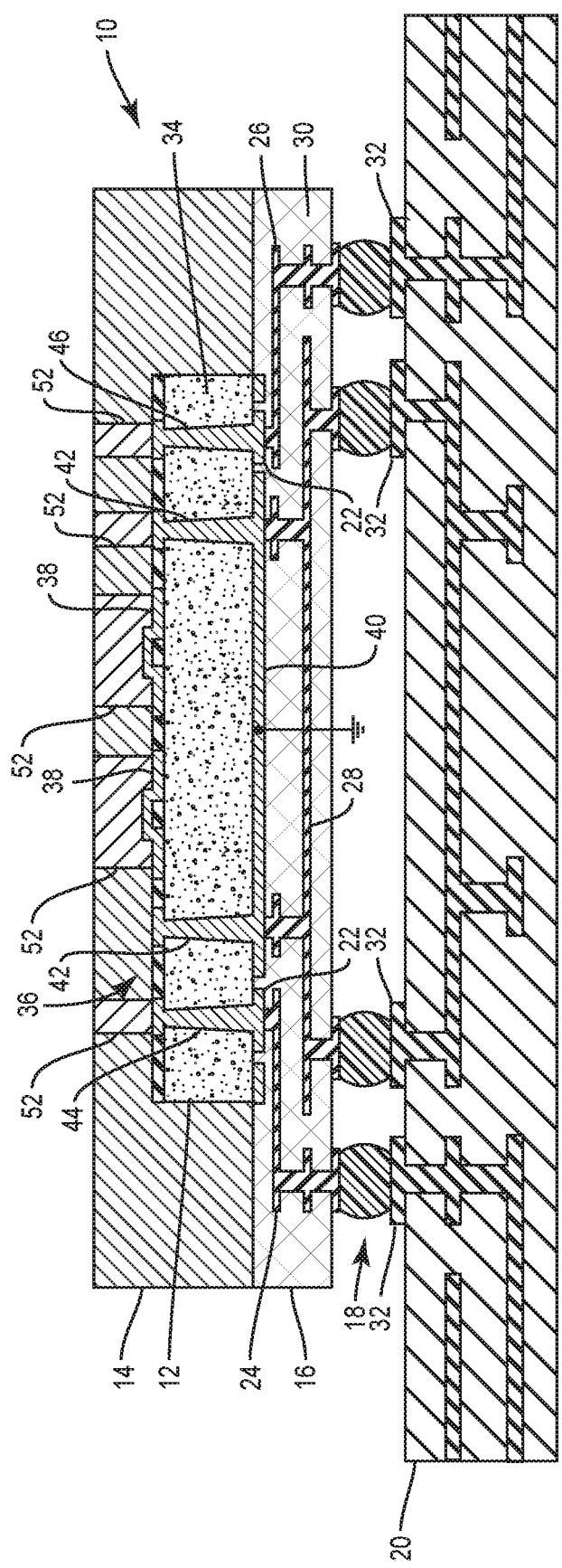
FIG. 4A is a cross-sectional view of another exemplary embodiment of the circuit package of FIG. 2 with conductive pillars through an overmold layer.

FIG. 4A is a cross-sectional view of another exemplary embodiment of the circuit package 10 with conductive pillars 52 through the overmold layer 14. The circuit package 10 of FIG. 4A has a chip side up MMIC die 12 as described above with respect to FIG. 2. With this orientation, a high thermal conductivity path can also be created through the top of the circuit package 10 if thermal spreaders are formed directly over the hot-spots on the active layer 36 of the MMIC die 12. For example, the conductive pillars 52 or other thermally conducting structures are formed over and near heat sources on the die (e.g., transistors or other active elements in the active layer).

Semiconductor processes currently practiced could be used to form the conductive pillars 52 similar to the formation of copper bumps for flip-chip-attached semiconductor die. The conductive pillars 52 can be used to conduct heat out of the top of the MMIC die 12 on the molded side of the circuit package 10 if the conductive pillars 52 are suitably exposed from the overmold layer 14. In this regard, the conductive pillars 52 can be formed before or after depositing the overmold layer 14. If formed before, the overmold layer 14 can be partially removed to expose the conductive pillars 52.

Figure 4B:
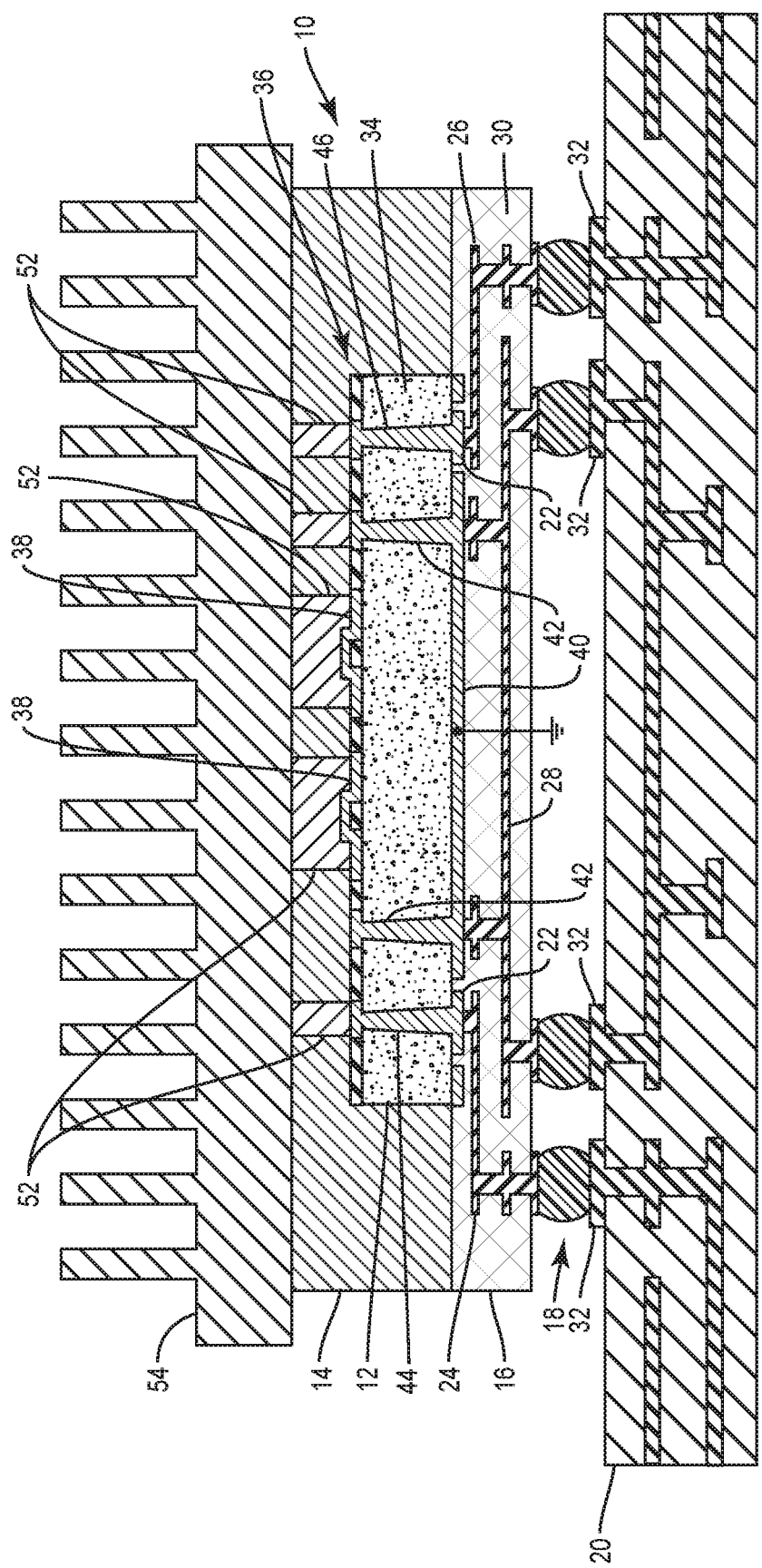
FIG. 4B is a cross-sectional view of another example of the embodiment of FIG. 4A with a heat exchanger attached to the conductive pillars.

FIG. 4B is a cross-sectional view of another example of the embodiment of FIG. 4A with a heat exchanger 54 attached to the conductive pillars 52. The heat exchanger 54 may be attached to the conductive pillars 52 and/or the overmold layer 14 through an appropriate technique, such as soldering or brazing to the conductive pillars 52 or through an adhesive (e.g., a thermal conducting adhesive). In this manner, the conductive pillars 52 provide thermal conduction to the heat exchanger 54. The heat exchanger 54 can be a heat sink or cold plate, and can exchange heat through liquid, air, conduction, convection, etc., as appropriate.

Figure 4C:
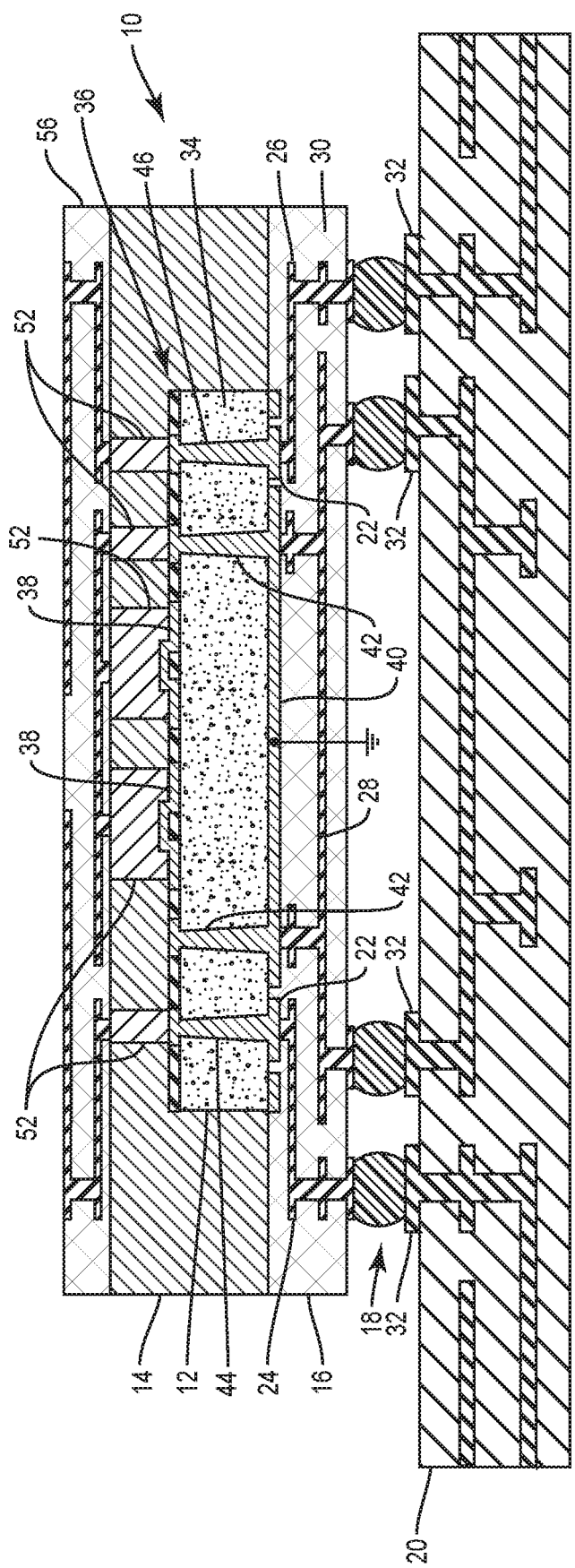
FIG. 4C is a cross-sectional view of another example of the embodiment of FIG. 4A with a circuit layer attached to the conductive pillars.

FIG. 4C is a cross-sectional view of another example of the embodiment of FIG. 4A with a circuit layer 56 attached to the conductive pillars 52. In addition to thermal conduction, the conductive pillars 52 can provide electrical conduction to features of the MMIC die 12. For example, the circuit layer 56 can provide interconnection between features of the MMIC die 12, an RF antenna connected to the MMIC die 12, connection to external circuits, and so on.

In other embodiments, the circuit package 10 can include multiple MMIC dice 12. The conductive pillars 52 can provide connection between these MMIC dice 12. In some embodiments, the circuit package 10 can include multiple MMIC dice 12 arranged laterally in a common overmold layer 14, as described further below with respect to FIGS. 5A and 5B. In other embodiments, the circuit package 10 can include multiple MMIC dice 12 stacked vertically, as described further below with respect to FIGS. 6A and 6B.

Figure 5A:
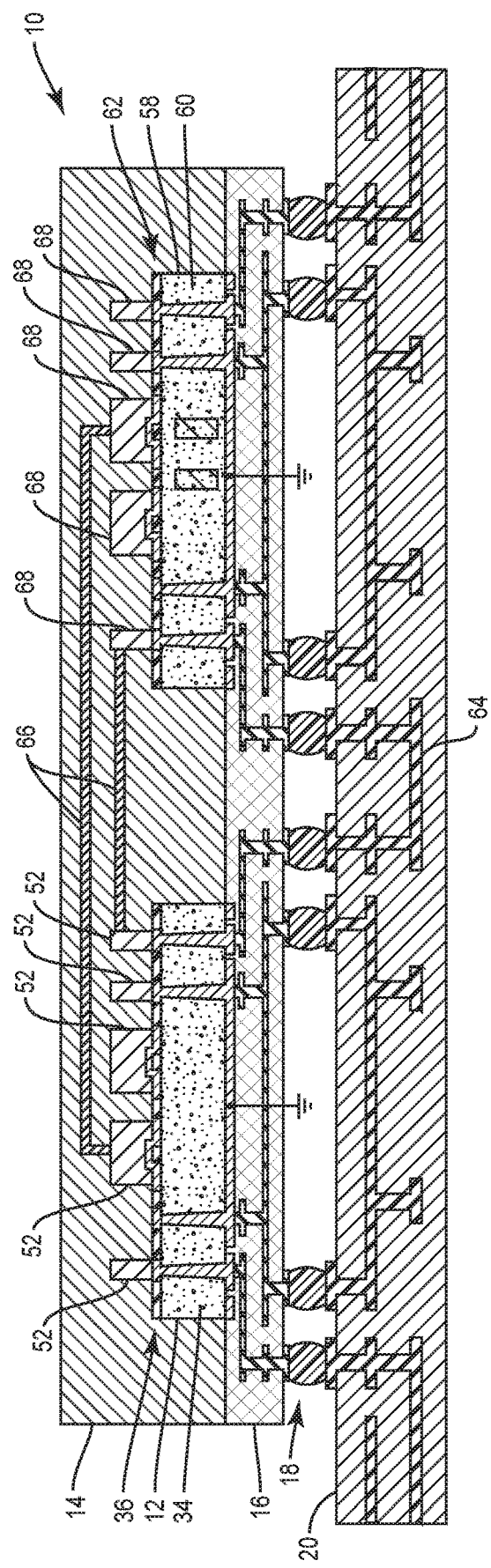
FIG. 5A is a cross-sectional view of another exemplary embodiment of the circuit package of FIG. 2 with a second MMIC die positioned laterally adjacent a first MMIC die.

FIG. 5A is a cross-sectional view of another exemplary embodiment of the circuit package 10 with a second MMIC die 58 positioned laterally adjacent a first MMIC die 12. In this regard, the first MMIC die 12 and the second MMIC die 58 are surrounded by the overmold layer 14 and attached to the RDL 16 in the FOWLP process described above. The first MMIC die 12 includes a first MMIC substrate 34 on which a first active layer 36 is formed, and the second MMIC die 58 includes a second MMIC substrate 60 on which a second active layer 62 is formed as described above with respect to FIGS. 1 and 2. Each of the first MMIC die 12 and the second MMIC die 58 is oriented chip side up—with the first active layer 36 and the second active layer 62 oriented away from the RDL 16.

Each of the first MMIC die 12 and the second MMIC die 58 is connected to the NHA 20 through the RDL 16 and the interconnection layer 18. In addition, the first MMIC die 12 and the second MMIC die 58 can be interconnected. For example, interconnection can be provided through one or more conductors 64 in the NHA 20 or the RDL 16. Additionally or alternatively, interconnection can be provided through front-side interconnects 66 connecting first conductive pillars 52 attached to the first active layer 36 (as described above with respect to FIG. 4A) to second conductive pillars 68 attached to the second active layer 62.

Figure 5B:
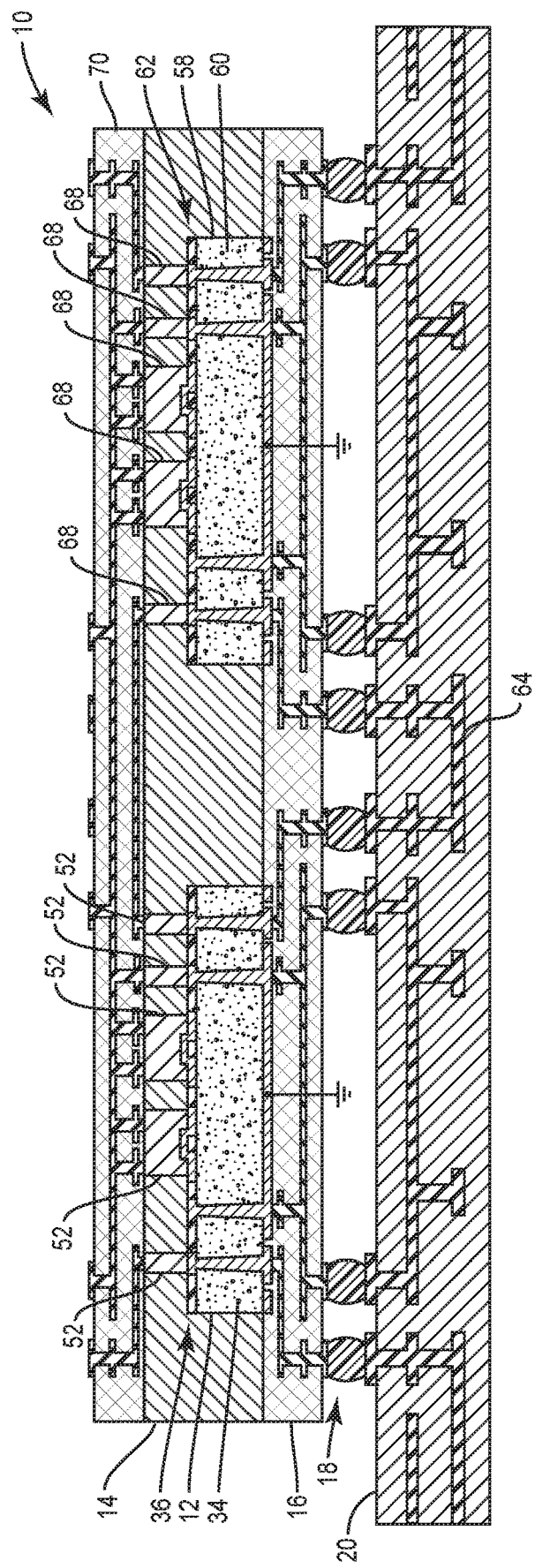
FIG. 5B is a cross-sectional view of another example of the embodiment of FIG. 5A with a second RDL attached to the overmold layer.

FIG. 5B is a cross-sectional view of another example of the embodiment of FIG. 5A with a second RDL 70 attached to the overmold layer. The second RDL 70 is attached to the overmold layer 14, the first conductive pillars 52, and the second conductive pillars 68. The second RDL 70 can be formed in a manner similar to the first RDL 16 attached to the bottom side of the overmold layer 14, the first MMIC die 12, and the second MMIC die 58 and provide interconnections between features of the first MMIC die 12 and features of the second MMIC die 58.

Figure 6A:
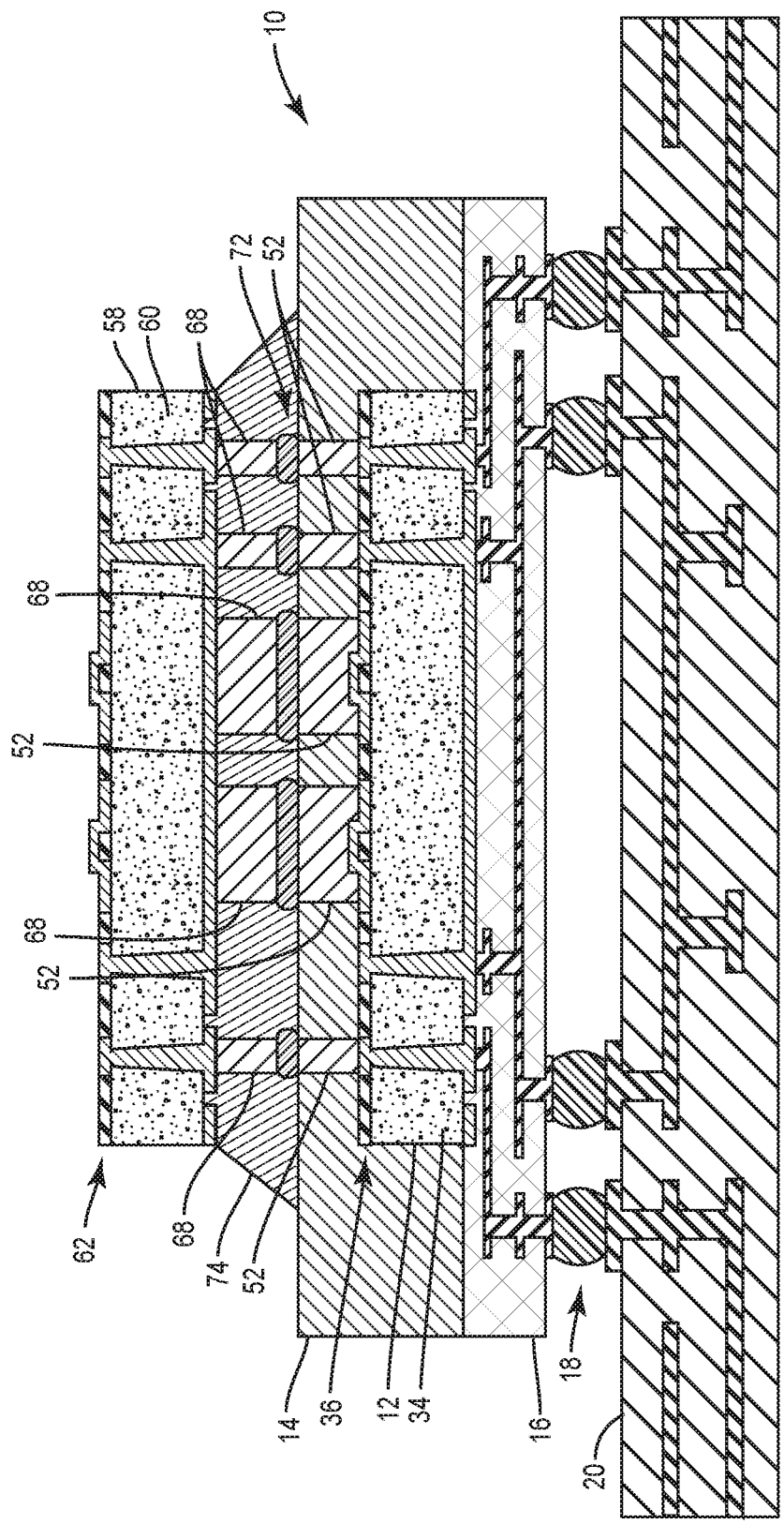
FIG. 6A is a cross-sectional view of another exemplary embodiment of the circuit package of FIG. 2 with a second MMIC die stacked vertically over the first MMIC die.

FIG. 6A is a cross-sectional view of another exemplary embodiment of the circuit package 10 with the second MMIC die 58 stacked vertically over the first MMIC die 12. In this regard, the first MMIC die 12 is surrounded by the overmold layer 14 and has first conductive pillars 52 through the overmold layer 14 as described above with respect to FIG. 4A. The second MMIC die 58 is similarly oriented chip up and stacked vertically over the first MMIC die 12. Second conductive pillars 68 are attached to the bottom side of the second MMIC die 58 to interconnect the first MMIC die 12 with the second MMIC die 58.

A second interconnection layer 72 attaches and connects the first conductive pillars 52 and the second conductive pillars 68. The second interconnection layer 72 can be a ball grid array, a land-grid array, or another appropriate interconnection similar to the first interconnection layer 18 which attaches the circuit package 10 to the NHA 20. An underfill layer 74 surrounds the second conductive pillars 68 and fills the space between the first MMIC die 12 and the overmold layer 14.

Figure 6B:
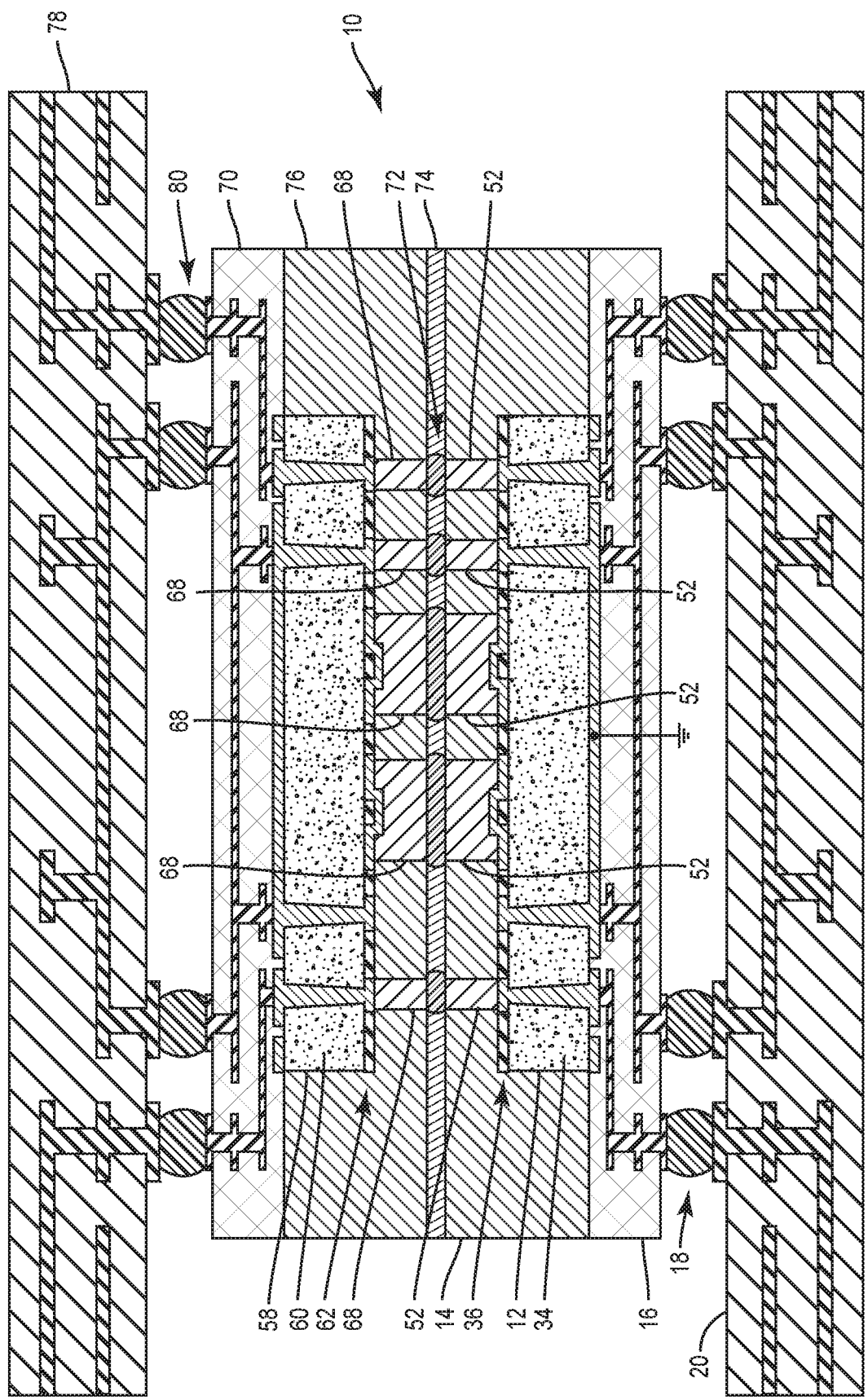
FIG. 6B is a cross-sectional view of another example of the embodiment of FIG. 6A with the second MMIC die flipped over the first MMIC die.

FIG. 6B is a cross-sectional view of another example of the embodiment of FIG. 6A with the second MMIC die 58 flipped over the first MMIC die 12. In this example, the second MMIC die 58 is flipped over the first MMIC die 12 with the second conductive pillars 68 attached to the top side of the second MMIC die 58 to interconnect the first MMIC die 12 with the second MMIC die 58. The second interconnection layer 72 attaches and connects the first conductive pillars 52 and the second conductive pillars 68.

In some examples, the second MMIC die 58 is also surrounded by a second overmold layer 76. The second MMIC die 58 can further be attached to the second RDL 70. In still other examples, the second RDL 70 can connect the second MMIC die 58 to a second NHA 78 through a third interconnection layer 80. It should be understood that further embodiments can include additional MMIC dice arranged vertically, horizontally, or a combination of such arrangements as described above with respect to FIGS. 5A-6B.

Those skilled in the art will recognize improvements and modifications to the preferred embodiments of the present disclosure. All such improvements and modifications are considered within the scope of the concepts disclosed herein and the claims that follow.

What is claimed is:

1. A circuit package, comprising:
a first monolithic microwave integrated circuit (MMIC) die having a chip side comprising one or more active elements of the first MMIC die;
an overmold layer at least partially surrounding the first MMIC die, the overmold layer being a singular layer and the overmold layer covering the chip side;
a redistribution layer (RDL) attached to a surface of the first MMIC die opposite the chip side, wherein the RDL comprises a plurality of signal lines connected to the one or more active elements on the chip side of the first MMIC die, wherein a length of the RDL is equal to a length of the overmold layer;
an interconnection layer attached to the RDL and configured to electrically connect the plurality of signal lines in the RDL to a next higher assembly; and
a plurality of hot vias through the first MMIC die;
wherein:
the chip side of the first MMIC die is oriented away from the RDL to reduce electromagnetic coupling between the plurality of signal lines of the RDL and at least one of the one or more active elements of the first MMIC die;
the surface of the first MMIC die opposite the chip side is a backside of the first MMIC die;
the circuit package further comprises a ground plane on a portion of the backside of the first MMIC die; and
at least one respective hot via in the plurality of hot vias operably connects the ground plane to at least one active element in the one or more active elements of the first MMIC die.

2. The circuit package of claim 1, wherein a portion of the plurality of hot vias through the first MMIC die are operably connected to corresponding signal lines of the plurality of signal lines of the RDL.

3. The circuit package of claim 1, wherein the RDL provides a thermal conduction path from the backside of the first MMIC die to the next higher assembly.

4. The circuit package of claim 2, further comprising a plurality of conductive pillars through the overmold layer.

5. The circuit package of claim 4, further comprising a heat exchanger attached to the overmold layer;
wherein the plurality of conductive pillars provides thermal conduction to the heat exchanger.

6. The circuit package of claim 4, wherein the plurality of conductive pillars are electrically connected to a second MMIC die.

7. The circuit package of claim 6, wherein the second MMIC die is attached to the circuit package over the first MMIC die.

8. The circuit package of claim 6, wherein:
the second MMIC die is positioned laterally adjacent the first MMIC die; and
the overmold layer at least partially surrounds the second MMIC die.

9. The circuit package of claim 1, wherein the RDL comprises a multilayer laminate.

10. The circuit package of claim 9, wherein the multilayer laminate of the RDL comprises an insulating material formed over the surface of the first MMIC die opposite the chip side.

11. The circuit package of claim 1, wherein the RDL is formed over the surface of the first MMIC die opposite the chip side.

12. The circuit package of claim 11, wherein:
the ground plane shields at least one of the one or more active elements of the first MMIC die from the plurality of signal lines.

13. The circuit package of claim 12, wherein the ground plane further shields the one or more active elements of the first MMIC die from signals in the next higher assembly.

14. The circuit package of claim 12, wherein the RDL comprises an insulating material formed over the ground plane.

* * * * *